(12) United States Patent
Edo (10) Patent No.: US 7,236,229 B2
(45) Date of Patent: Jun. 26, 2007

(54) LOAD LOCK CHAMBER, PROCESSING SYSTEM

(75) Inventor: Ryo Edo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 705 days.

(21) Appl. No.: 10/794,499

(22) Filed: Mar. 5, 2004

(65) Prior Publication Data

US 2004/0175906 A1     Sep. 9, 2004

(30) Foreign Application Priority Data

Mar. 6, 2003   (JP) .............................. 2003-060566

(51) Int. Cl.
G03B 27/42  (2006.01)
G03B 27/58  (2006.01)
G03B 27/62  (2006.01)
G03B 27/32  (2006.01)

(52) U.S. Cl. ........................... 355/53; 355/72; 355/75; 355/77; 414/935; 414/938; 414/939

(58) Field of Classification Search ................. 355/53, 355/72, 75, 77; 414/935, 936, 937, 938, 414/939, 940, 941; 156/345.27, 345.31; 118/712, 719

See application file for complete search history.

(56) References Cited

U.S. PATENT DOCUMENTS 5,248,886 A * 9/1993 Asakawa et al. ...... 250/442.11
5,303,671 A * 4/1994 Kondo et al. ................ 118/719
5,943,230 A   8/1999 Rinnen et al. ............... 364/147
6,805,748 B1 10/2004 Edo ........................... 118/719
2003/0015290 A1  1/2003 Edo ...................... 156/345.27

FOREIGN PATENT DOCUMENTS

| JP | 04-277025 | 10/1992 |
| JP | 06-318536 | 11/1994 |
| JP | 7-142408 | * 6/1995 |
| JP | 09-085076 | 3/1997 |
| JP | 2001-118904 | 4/2001 |
| JP | 2003-31639 | 1/2003 |

OTHER PUBLICATIONS

English Translation of JP 7-142408 (dated Jun. 2, 1995).*

* cited by examiner

*Primary Examiner*—Alan Mathews
(74) *Attorney, Agent, or Firm*—Morgan & Finnegan, LLP (57) ABSTRACT

A load lock chamber provided between a port that accommodates an object to be processed and is maintained at an ambient pressure, and a process chamber that is maintained at a reduced pressure or vacuum environment and performs a predetermined process for the object, said load lock chamber replacing an atmosphere in said load lock chamber and delivering the object between the port and the process chamber includes a first load lock chamber that includes a first holder for holding the object received from the port, and a second load lock chamber that includes a second holder for holding the object received from the process chamber, wherein the first holder holds more objects than the second holder.

10 Claims, 7 Drawing Sheets

FIG. 7
PRIOR ART ated herein by reference herein in
LOAD LOCK CHAMBER, PROCESSING SYSTEM This application claims a benefit of priority based on Japanese Patent Application No. 2003-060566 filed on Mar. 6, 2003, which is hereby incorporated by reference herein in its entirety as if fully set forth herein.

BACKGROUND OF THE INVENTION

The present invention relates generally to a load lock chamber, and more particularly to a load lock chamber for use with a fabrication process of a semiconductor substrate, a liquid crystal display ("LCD") plate, etc., which transports an object, such as a semiconductor substrate and an LCD, from a port as a supply part to a process chamber that provides an exposure process etc., and replaces an atmosphere between the ambient pressure and a reduced pressure environment. The present invention is also directed to a processing system having this load lock chamber.

Recent demands for smaller and lower profile electronic apparatuses have increasingly sought for finer semiconductor devices to be mounted onto these electronic apparatuses. A projection exposure apparatus has been conventionally employed which projects a circuit pattern formed on a mask (or a reticle) onto a wafer etc. via a projection optical system to transfer the circuit pattern in the lithography for manufacturing semiconductor devices.

The minimum critical dimension transferable by the projection exposure apparatus or resolution is proportionate to a wavelength of light used for exposure, and inversely proportionate to the numerical aperture ("NA") of the projection optical system. The shorter the wavelength is, the higher the resolution is. Therefore, a shorter wavelength of a recent exposure light source has been promoted from KrF excimer laser (with a wavelength of approximately 248 nm) to ArF excimer laser (with a wavelength of approximately 193 nm), $F_2$ laser (with a wavelength of approximately 157 nm), and soft X-rays from a synchrotron radiation ring.

Since exposure light with a short wavelength, such as light from an $F_2$ laser and soft X-rays, greatly attenuate in the air, it has been proposed to accommodate an exposure part of an exposure apparatus in a chamber, and to replace the atmosphere in the chamber with nitrogen ($N_2$) and reduced pressure helium (He) which do not cause much attenuation of the exposure light. There are proposed an electron beam exposure apparatus, an EUV exposure apparatus etc. that use a vacuum atmosphere. A processing apparatus, such as a CVD apparatus, often replaces an inner atmosphere with a gas atmosphere different from the air and a vacuum atmosphere for prevent the resist on a substrate from oxidizing or for the process gas different from the air.

Figure 6:
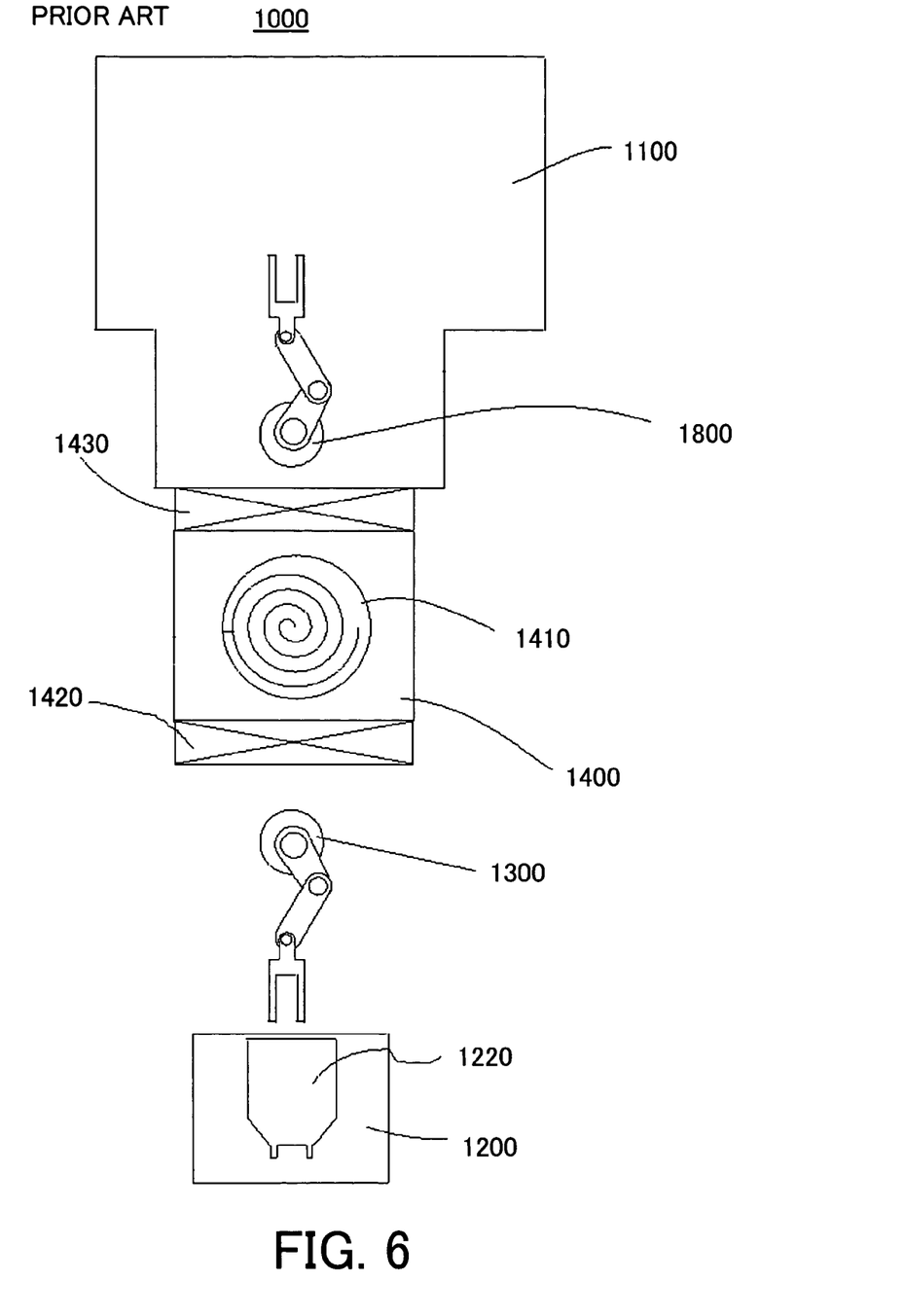
FIG. 6 is a schematic block diagram showing a conventional processing system.
Figure 7:
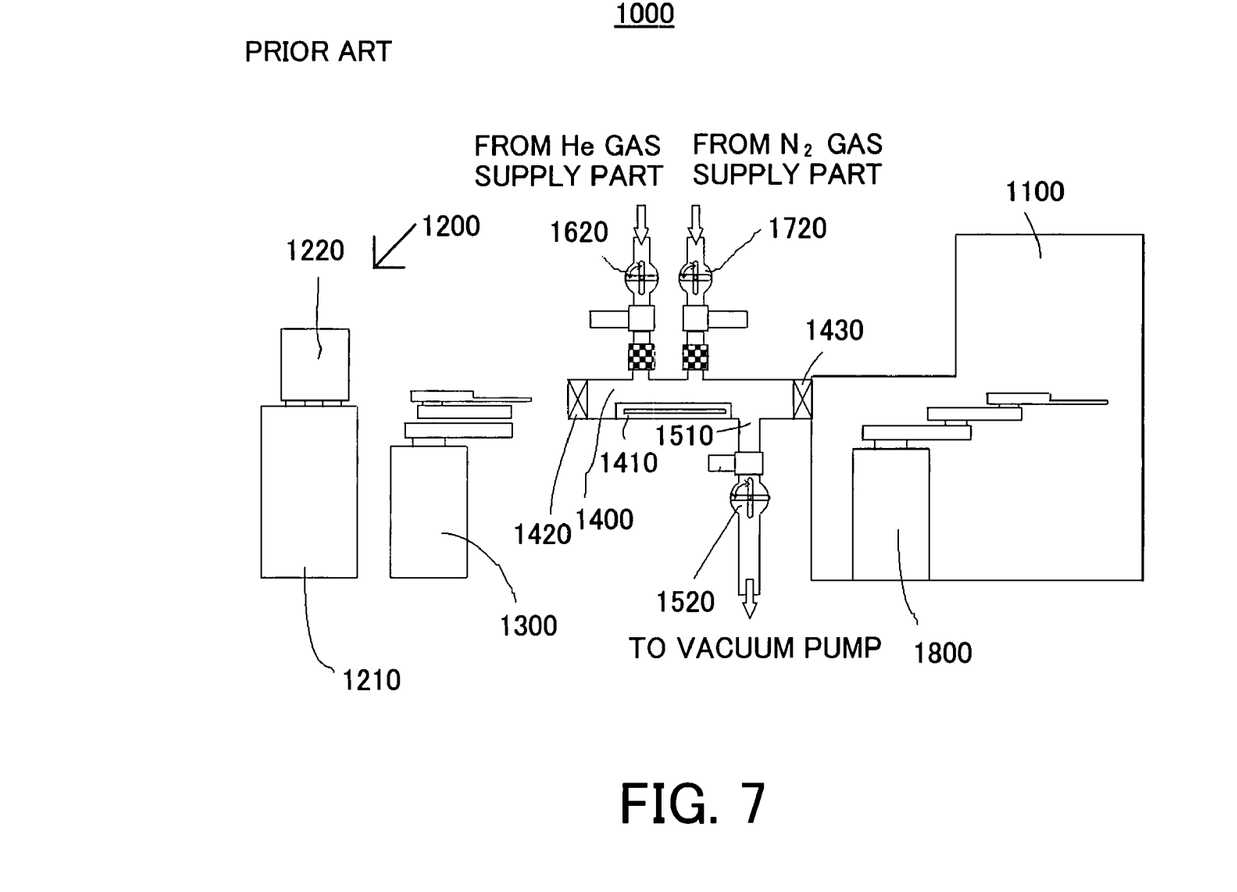
FIG. 7 is a schematic block diagram of a detailed structure of the conventional processing system.

FIG. 6 is a schematic block diagram of a conventional processing system 1000. FIG. 7 is a schematic block diagram of a detailed structure of the conventional processing system 1000. Referring to FIGS. 6 and 7, the conventional processing system 1000 typically includes a load lock chamber 1400 that delivers a wafer, such as a semiconductor substrate and a LCD plate, between a port 1200 as a supply part and a process chamber 1100 that provides an exposure process etc., and replaces an atmosphere between the ambient pressure and a reduced pressure environment.

A first transport means 1300 picks up one wafer from a wafer carrier 1222 on a wafer carrier holder chuck 1210, and delivers the wafer to the load lock chamber 1400. When the wafer is carried to the load lock chamber 1400 and placed on a wafer holder chuck 1410, a first gate valve 1420 closes for disconnection from the air, and the atmosphere in the load lock chamber 1400 is replaced. A description will now be given of a replacement of the atmosphere in the load lock chamber 1400.

When the first and second gate valves 1420 and 1430 close for disconnections of the load lock chamber 1400 from the air and the process chamber 1100, an exhaust valve 1520 opens and a vacuum pump (not shown) exhausts the load lock chamber 1400. After the load lock chamber 1400 is exhausted to the predetermined degree of vacuum, the exhaust valve 1520 closes and stops vacuum-pumping.

Then, a He gas supply valve 1620 opens to supply He gas to the load lock chamber 1400 from a He gas supply unit (not shown) through a He gas pipe 1610. The load lock chamber 1400 includes a $N_2$ gas supply valve 1720 in addition to the He gas supply valve 1620. Since the He gas supply valve 1620 supplies gas for the (reduced He) atmosphere in the process chamber 1100 that accommodates the exposure part, the load lock chamber 1400 opens the He gas supply valve 1620 to supply He gas until the load lock chamber 1400 and the process chamber 1100 have the same pressure.

When they have the same pressure, the He gas supply valve 1620 closes and stops supplying the He gas, and ends a replacement of the atmosphere in the load lock chamber 1400.

Subsequent to the replacement of the atmosphere in the load lock chamber 1400, the second gate valve 1430 opens and a second transport means 1800 in the process chamber 1100 takes out the wafer and delivers it to the exposure part accommodated in the process chamber 1100. The wafer exposed by the exposure part is returned to the wafer carrier 1220 via the load lock chamber 1400 by the first and second transport means 1300 and 1400.

There are time limits defined by the following Equation 1, where the processing system 1000 has the throughput of 60 sheets per hour, there are two load lock chambers 1400 for improved throughput, each acting in the same way, "a" [s] is a wafer transport time of the first transport means 1300, "b" [s] is a wafer transport time of the second transport means 1800, "c" [s] is an atmosphere replacement time (from the air to He) in the load lock chamber 1400, and "d" [s] is an atmosphere replacement time (from He to the air) in the load lock chamber 1400:

$$a\times 2+b\times 2+c+d<60[s]\times 2 \tag{1}$$

If the wafer transport time "a" [s] of the first transport means 1300 and the wafer transport time "b" [s] of the second transport means 1800 are each 10 [s], then the replacement time of the atmosphere in the load lock chamber 1400 is totally 80 [s]. When it is assumed that it takes about 10 [s] to introduce He gas and it takes about 15 [s] to introduce the air, the time limits are not met unless the air is exhausted in 30 [s] and the He atmosphere is exhausted in 25 [s]. In replacing the atmosphere in the load lock chamber 1400 (from He to the air), the air may be merely introduced in 60 [s] without an exhaustion of He gas.

A replacement of the load lock chamber with a vacuum atmosphere has two significant problems: Firstly, while the gas is being exhausted from the load lock chamber, the gas's temperature drop due to the adiabatic expansion cools a wafer that contacts gas. The wafer's temperature drop exceeds its temperature stability budget required in the exposure.

The other problem is adhesions of particles to the wafer. More specifically, the exhaustion blows particles up in exchanging an atmosphere in the load lock chamber, causing them to adhere to the wafer. It is also pointed out that the gas's temperature drop below the dew point due to the adiabatic expansion separates out moisture in the gas, causing the moisture to adhere to the wafer with neighboring fine particles when the moisture coagulates. Disadvantageously, the particles adhered wafer does not accept high-quality processes.

Accordingly, conventional methods have proposed to slow vacuum-pumping at the inception of the exhaustion, and to supply gas simultaneous with the exhaustion (see, for example, Japanese Patent Applications, Publication Nos. 6-318536 and 9-85076). These methods reduce initial exhaust amounts, whereby the retarded exhaustion mitigates the gas flow and restrains particles' blowing up.

In addition, the long exhaust time extends the heat exchange time between the process chamber and the gas, and gas's temperature drop. During the exhaustion, the gas's temperature drops due to the adiabatic expansion. However, indeed the gas contacts walls of the load lock chamber, receives heat, and does not exhibit a complete adiabatic expansion. As the exhaust time becomes long, the contact time with the walls of the load lock chamber becomes long, the gas receives more heat through heat exchanges with the process chamber, and the gas's temperature drop amount reduces.

However, the slow exhaustion naturally delays a completion of exhaustion. The throughput is an important exposure factor necessary for one wafer, and the long exhaust time in the load lock chamber lowers the throughput. In other words, the above methods do not sufficiently take care of the throughput deterioration.

While the above time limits are to maintain the throughput and to replace the atmosphere in the load lock chamber, the time periods, such as maximum 60 [s] for a replacement of the atmosphere in the load lock chamber, which includes 25 [s] to 30 [s] for an gas exhaustion and 10 to 15 [s] for a gas supply, are not sufficient for disadvantageous particles' blowing up and gas's temperature drop.

BRIEF SUMMARY OF THE INVENTION

Accordingly, it is an exemplified object of the present invention to provide a load lock chamber, and a processing system, which maintain predetermined throughput, reduces temperature drops of a wafer caused by adiabatic expansions and particles' adhesions to the wafer in exchanging an atmosphere, and provides high-quality processing.

A load lock chamber of one aspect according to the present invention provided between a port that accommodates an object to be processed and is maintained at an ambient pressure, and a process chamber that is maintained at a reduced pressure or vacuum environment and performs a predetermined process for the object, the load lock chamber replacing an atmosphere in the load lock chamber and delivering the object between the port and the process chamber, includes a first load lock chamber that includes a first holder for holding the object received from the port, and a second load lock chamber that includes a second holder for holding the object received from the process chamber, wherein the first holder holds more objects than the second holder.

A processing system or an exposure processing system of another aspect according to the present invention includes a port that accommodates an object to be processed and is maintained at an ambient pressure, a process chamber that is maintained at a reduced pressure or vacuum environment and performs a predetermined process for the object, and the load lock chamber replacing an atmosphere and delivering the object between the port and the process chamber, wherein the load lock chamber includes a first load lock chamber that includes a first holder for holding the object received from the port, and a second load lock chamber that includes a second holder for holding the object received from the process chamber, and wherein the first holder holds more objects than the second holder.

The first load lock chamber may have an inner capacity of about 40 liters, and the second load lock chamber may have an inner capacity of about 8 to 10 liters. The load lock chamber may include plural first load lock chambers. It can take a longer time to replace an atmosphere in the first load lock chamber than to replace an atmosphere in the second load lock chamber.

A device fabricating method includes the steps of exposing an object using the above exposure processing system, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
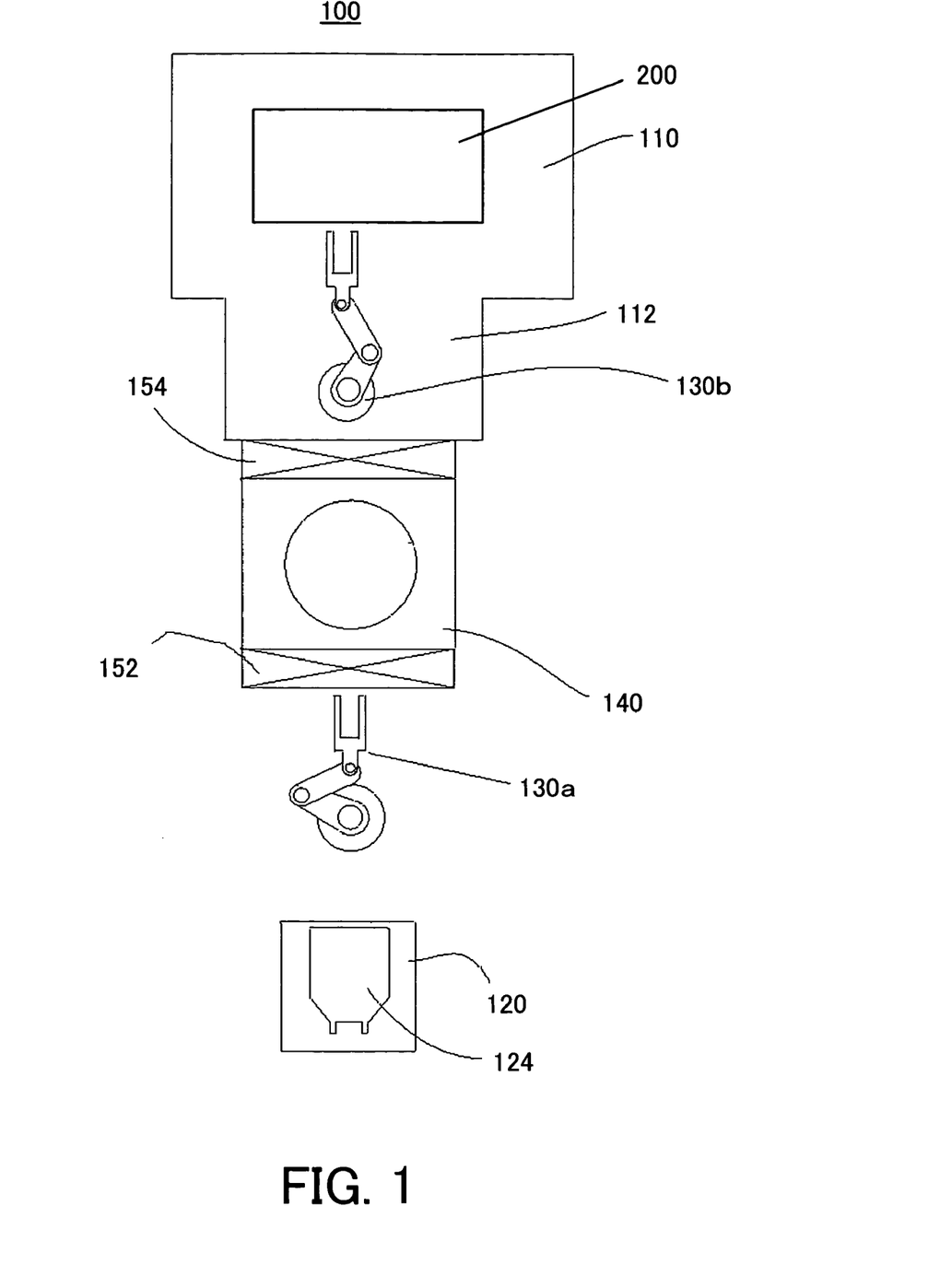
FIG. 1 is a schematic block diagram of a processing system of one embodiment according to the present invention.
Figure 2:
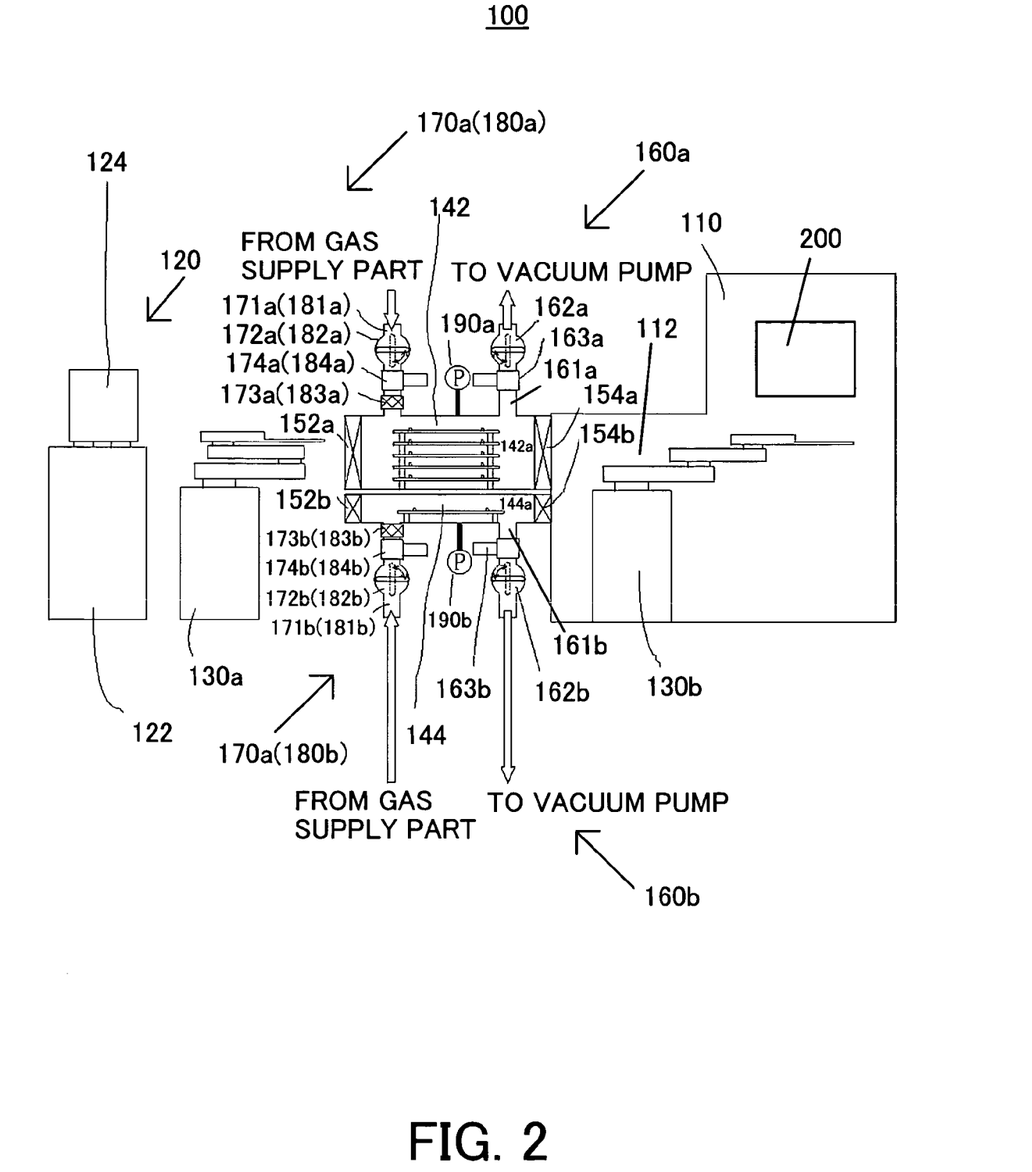
FIG. 2 is a schematic block diagram of a detailed structure of the processing system shown in FIG. 1.

A description will now be given of a processing system 100 as one aspect of the present invention with reference to the accompanying drawings. The same reference numeral in each figure denotes the same element, and a description thereof will be omitted. Here, FIG. 1 is a schematic block diagram of the processing system 100. FIG. 2 is a schematic block diagram of a detailed structure of the processing system 100.

While the processing system 100 of the instant embodiment exposes a wafer as an object to be exposed, the present invention does not limit the process by the processing apparatus to exposure. Of course, the exposure process is suitable for the present invention since the exposure process requires high throughput as discussed above.

The processing system 100 includes, as shown in FIG. 1, a process chamber 110, a preliminary chamber 112, a port 120, a first transport means 130*a*, a second transport means 130*b*, a load lock chamber 140, a first gate valve 152 (that includes first gate valves 152a and 152b), and a second gate valve 154 (that includes second gate valves 154a and 154b).

The process chamber 110 contains an exposure apparatus 200 as an exposure processing part or processing station for an object, which will be described later with reference to FIG. 3, and is maintained at reduced pressure He. The preliminary chamber 112 is provided in the process chamber 110, and equipped with the second transport means 130b for feeding the object into and out of the exposure processing part in the process chamber 110.

The port 120 accommodates one or more objects, and is maintained at the ambient pressure. The port 120 in the instant embodiment serves as both an object supply part and an object collect part, or an accommodation part for substrates before and after the process. The port has a carrier mount part 122, which is mounted with a carrier 124 into which one or more objects are placed manually or by an automatic feeder. The first transport means 130a is provide in the air, and carries the object between the carrier 124 on the carrier mount part 122 and the load lock chamber 140.

The first and second transport means 130a and 130b can rotate and translate, and includes an arm that can support the object. The first and second transport means 130a and 130b can apply any technology known in the art, such as a cluster tool, and a detailed description thereof will be omitted.

The load lock chamber 140 serves to replace an atmosphere between an ambient pressure atmosphere and a reduced pressure or vacuum environment atmosphere, and includes, as shown in FIG. 2, a first load lock chamber 142 having a first holder 142a for holding the object received from the port 120, and a second load lock chamber 144 having a second holder 144a for holding the object received from the process chamber 110.

The first load lock chamber 142 receives an object before it is processed, and supplies it to the process chamber 110. The first load lock chamber 142 is connected to a first gate valve 152a at the air side for disconnection from the port in the air, and a second gate valve 154a at the side of the process chamber 110 for disconnection from the preliminary chamber 112.

The first load lock chamber 142 is provided with exhaust means 160a for exhausting the first load lock chamber 142, He gas supply part 170a for supplying He gas, and $N_2$ supply part 180a for supplying $N_2$ gas.

The first load lock chamber 142 has a pressure sensor 190a that detects the pressure in the first load lock chamber 142. The pressure sensor 190a is connected to a controller (not shown). This controller controls opening and closing of valves 172a and 182a based on the detection result by the pressure sensor 190a. This controller controls opening and closing the first gate valve 152a and the second gate valve 154a based on the opening and closing of the valves 172a and 182a. In addition, a detector (not shown) is provided to detect opening and closing of the first gate valve 152a and the second gate valve 154a, and the controller may control actions of the first and second transport means 130a and 130b based on the detection result by the detector.

The exhaust means 160a has a vacuum pump (not shown), an exhaust pipe 161a that connects the vacuum pump and the first load lock chamber 142, a valve 162a that controls exhaustions, and a flowmeter 163a that measures gas flows in the exhaust pipe 161a.

The He gas supply part 170a and $N_2$ supply part 180a are structurally similar, and include supply pipes 171a and 181a that connect gas supply parts (not shown) to the first load lock chamber 142, valves 172a and 182a for controlling gas supplies, and gas supply flowmeters 174a and 184a provided between the valves 172a and 182a and the process chamber 110. The supplied gases pass through the valves 172a and 182a and gas supply flowmeters 174a and 184a from the gas supply parts, and filters 173a and 183a eliminate particles included in these gases when these gases pass through the filters 173b and 183b. Thereby, cleaned gases are supplied to the first load lock chamber 142.

The first holder 142a in the first load lock chamber 142 is configured to accommodate at least two objects, for example, 25 objects in the instant embodiment.

The second load lock chamber 144 receives a processed object from the process chamber 110, and supplies it to the port 120 or another apparatus (such as a posttreatment part). The second load lock chamber 144 is connected to a first gate valve 152b at the air side for disconnection from the port in the air, and a second gate valve 154b at the side of the process chamber 110 for disconnection from the preliminary chamber 112.

The first load lock chamber 142 is provided with exhaust means 160b for exhausting the second load lock chamber 142, He gas supply part 170b for supplying He gas, and $N_2$ supply part 180b for supplying $N_2$ gas.

The second load lock chamber 144 has a pressure sensor 190b that detects the pressure in the second load lock chamber 144. The pressure sensor 190b is connected to a controller (not shown). This controller controls opening and closing of valves 172b and 182b based on the detection result by the pressure sensor 190b. This controller controls opening and closing the first gate valve 152b and the second gate valve 154b based on the opening and closing of the valves 172b and 182b. In addition, a detector (not shown) is provided to detect opening and closing of the first gate valve 152b and the second gate valve 154b, and the controller may control actions of the first and second transport means 130a and 130b based on the detection result by the detector.

The exhaust means 160b has a vacuum pump (not shown), an exhaust pipe 161b that connects the vacuum pump and the second load lock chamber 144, a valve 162b that controls exhaustions, and a flowmeter 163a that measures gas flows in the exhaust pipe 161b.

The He gas supply part 170b and $N_2$ supply part 180b are structurally similar, and include supply pipes 171b and 181b that connect gas supply parts (not shown) to the second load lock chamber 144, valves 172b and 182b for controlling gas supplies, and gas supply flowmeters 174b and 184b provided between the valves 172b and 182b and the process chamber 110. The supplied gases pass through the valves 172b and 182b and gas supply flowmeters 174b and 184b from the gas supply parts, and filters 173b and 183b eliminate particles included in these gases when these gases pass through the filters 173b and 183b. Thereby, cleaned gases are supplied to the second load lock chamber 144.

The first holder 144a in the first load lock chamber 144 is configured to accommodate one object in the instant embodiment.

The second load lock chamber 144, first and second transport means 130a and 130b are configured to transport an object one by one, but the present invention is not limited to this configuration and may have a configuration that accommodates and carries plural objects to be processed. In that case, the first load lock chamber 142 preferably accommodates more objects than the second load lock chamber 144. In supplying the object to the process chamber 110, a simultaneous supply of plural objects can finish the supply action promptly because the atmosphere is replaced less frequently. On the other hand, the reduced number of objects to be transported is preferable for reduced stay time of the object.

The inner capacity of the load lock chamber 140 is minimized for minimum exhaust time. The instant embodiment uses an object to be processed with a diameter of 300 mm, the first load lock chamber 142 with an inner capacity of about 40 liters for a bottom area that projects the object's area and the height of about 30 cm, and the second load lock chamber 144 with an inner capacity of about 8 to 10 liters for a bottom area that projects the object's area and the height of about 5 cm.

A description will now be given of a transport action of the object in a processing method that uses the processing system 100. The first transport means 130a takes out one or more objects from the carrier 124 placed on the carrier mount part 122. The first transport means 130a that grasps the object pulls back the arm, and checks the atmosphere state in the first load lock chamber 142. Suppose that the first load lock chamber 142 has an ambient pressure atmosphere.

The first transport means 130a rotates the arm towards the first load lock 142, expands the arm after confirming the opening state of the first gate valve 152a, delivers the object in the first load lock chamber 142, and places the object on the first holder 142a. The first transport means 130a repeats the same actions to all the holding slots in the first holder 42a, and transports 25 objects to the first load lock chamber 142 in the instant embodiment.

When the first transport means 130a pulls back the arm and retreats, the first gate valve 152a closes, followed by the replacement of the atmosphere in the first load lock chamber 142 from the ambient pressure atmosphere to a He atmosphere.

In the replacement of the atmosphere in the first load lock chamber 142, the first and second gate valves 152a and 154a close to isolate the atmosphere in the first load lock chamber 142. Then, the valve 162a opens, and the vacuum pump (not shown) exhausts the first load lock chamber 142 through the exhaust pipe 161a. When the measurement value of the pressure sensor 190a indicates that the pressure of the first load lock chamber 142 becomes the predetermined value after the vacuum pumping starts, the valve 162a closes to stop the exhaustion.

Next, the valve 172a opens. While the first load lock chamber 142 is provided with the valves 172a and 182a for He and $N_2$ gas supplies, the He gas valve 172a opens as a supply valve of the same gas as the atmosphere in the process chamber 110. A supply of He gas continues until the pressure in the first load lock chamber 142 is equal to the pressure in the process chamber 110. When the pressure sensor 190a detects that the pressure in the first load lock chamber 142 is equal to the pressure in the process chamber 110, the valve 172a closes to stop a supply of He gas.

When the valve 172a closes and a supply of He gas stops, the second gate valve 154a opens, and the second transport means 130b in the preliminary chamber 112 takes the object out of the first load lock chamber 142 and carries the object to the processing station (not shown) for a predetermined process.

If it is assumed that the processing system 100 has the throughput of 60 sheets per hour, the permissible time to deliver these twenty-five objects is 25 minutes. In opening the load lock chamber 142 to the air, gas can be introduced into or exhausted from the first load lock chamber 142, for example, for 30 [s], since the object has not yet been fed into the load lock chamber 140 or there is no influence on the object.

If it is assumed that it takes 10 [s] per sheet for the first transport means 130a to transport the object, it takes 250 [s] to accommodate 25 objects in the first load lock chamber 142.

If it is assumed that it takes 30 [s] to open to the air, as discussed, the permissible time to replace the first load lock chamber 142 to the He atmosphere is: 25 [m]−250 [s]×2−30 [s]=970 [s].

Since the instant embodiment uses a reduced pressure He atmosphere for the process chamber 110, the time to introduce the reduced pressure gas is needed after the first load lock chamber 142 is vacuum-pumped.

He gas is introduced preferably slowly because it is conceivable that the introduced He gas flow blows up particles.

The instant embodiment can spend 11 minutes to vacuum-pump the first load lock chamber 142, and 5 minutes to introduce reduced He gas. While the inner capacity of the first load lock chamber 142 is fourth to fifth as large as that in the conventional one that accommodates only one object, the permissible exhaust time is 670 [s], about 19 times as long as conventional [s]. Therefore, the extremely slow exhaust is relatively available.

The slow exhaust of the first load lock chamber 142 with an inner capacity of about 40 liters by taking about 11 minutes would restrain cooling of the gas due to the adiabatic expansion, and the temperature drop of the gas below the due point. In addition, the extremely mild gas flow would not blow particles up. Therefore, the first load lock chamber 142 can restrain adhesions of particles to the object and the temperature drop of the object.

The permissible introduction time of He to the first load lock chamber 142 is five minutes, 30 times as long as conventional time, and the extremely mild gas flow would not blow particles up.

The above time periods are for exemplary purposes and may vary as long as the total time of a combination of supply and exhaust of gases, transport of the object, and opening to the air is within 25 minutes or meets required throughput.

The second transport means 130b takes the object, which has been processed by the process station, out of the process chamber 110. The second transport means 130b that grasps the object checks the atmosphere state in the second load lock chamber 144. Suppose that the second load lock chamber 144 has only the He gas atmosphere.

The second transport means 130b rotates the arm towards the second load lock 144, expands the arm after confirming the opening state of the second gate valve 154b, delivers the object in the second load lock chamber 144, and places the object on the second holder 144a.

When the second transport means 130b pulls back the arm and retreats, the second gate valve 154 closes, followed by a replacement of the atmosphere in the second load lock chamber 144 from the He atmosphere to the ambient pressure atmosphere.

In replacing an atmosphere in the second load lock chamber 144, the first gate valve 154a and the second gate valve 154b close to isolate the atmosphere in the second load lock chamber 144. Next, the valve 172b closes and the gas supply part (not shown) supplies He gas to the second load lock chamber 144 through the supply pipe 171a. When the He gas is introduced and the measurement value of the pressure sensor 190b indicates that the pressure of the second load lock chamber 144 becomes the ambient pressure, the valve 172b closes to stop introducing the He gas.

While the instant embodiment is configured to introduce two types of gasses, such as He gas and $N_2$ gas, to the second load lock chamber 144 according to the prior art, no functional problems occur even when the second load lock chamber 144 may include only one of the He gas supply part 170a and $N_2$ gas supply part 180b.

When the second load lock chamber 144 has the ambient pressure, the first gate valve 152b closes and the object is carried to the carrier 124 placed on the carrier mount part 122.

After the object transportation finishes, the first gate valve 152b closes and the second exhaust means 160b exhausts the second load lock chamber 144. In this case, the second load lock chamber 144 does not have any object, and thus the possible highest speed exhaustion does not raise a problem.

Here, there are time limits defined by the following Equation 2, where there are two load lock chambers 144 for improved throughput, each acting in the same way, $a_2$ [s] is a wafer transport time of the first transport means 130a, $b_2$ [s] is a wafer transport time of the second transport means 130b, $c_2$ [s] is an atmosphere replacement time (from the air to He) in the second load lock chamber 144, and $d_2$ [s] is an atmosphere replacement time (from He to the air) in the second load lock chamber 144:

$$a_2 \times 2 + b_2 \times 2 + c_2 + d_2 < 60 [s] \times 2 \quad (2)$$

Equation 2 is similar to Equation 1 in the prior art, but different from Equation 1 in that the atmosphere replacement time $c_2$ (from the air to He) in the second load lock chamber 144 can be shortened. In other words, both a step of replacement from the air to the vacuum and a step of replacement from the vacuum to the He atmosphere can run at their maximum speeds without considering problems of particles' blowing up, etc.

For example, when the atmosphere replacement time $c_2$ in the second load lock chamber 144 from the air to the He atmosphere is 10 [s], the gas introduction time can be maintained for the atmosphere replacement time $d_2$ from He to the air in the second load lock chamber 144. This is six times as long as 15 [s] in the prior art, and such slow gas introductions can restrain blowing up of particles, which would otherwise occur by the gas flow.

The throughput further improves when two pairs of the first load lock chambers 142 and the second load lock chambers 144, and one pair transports an object while the atmospheres of the other pair are replaced. However, the number of pairs is not limited to two, and may be three or more. In addition, the number of the first load lock chambers 142 is not necessarily the same as the number of the second load lock chambers 144. Rather, the number of the first load lock chambers 142 is more than the number of second load lock chambers 144.

Figure 3:
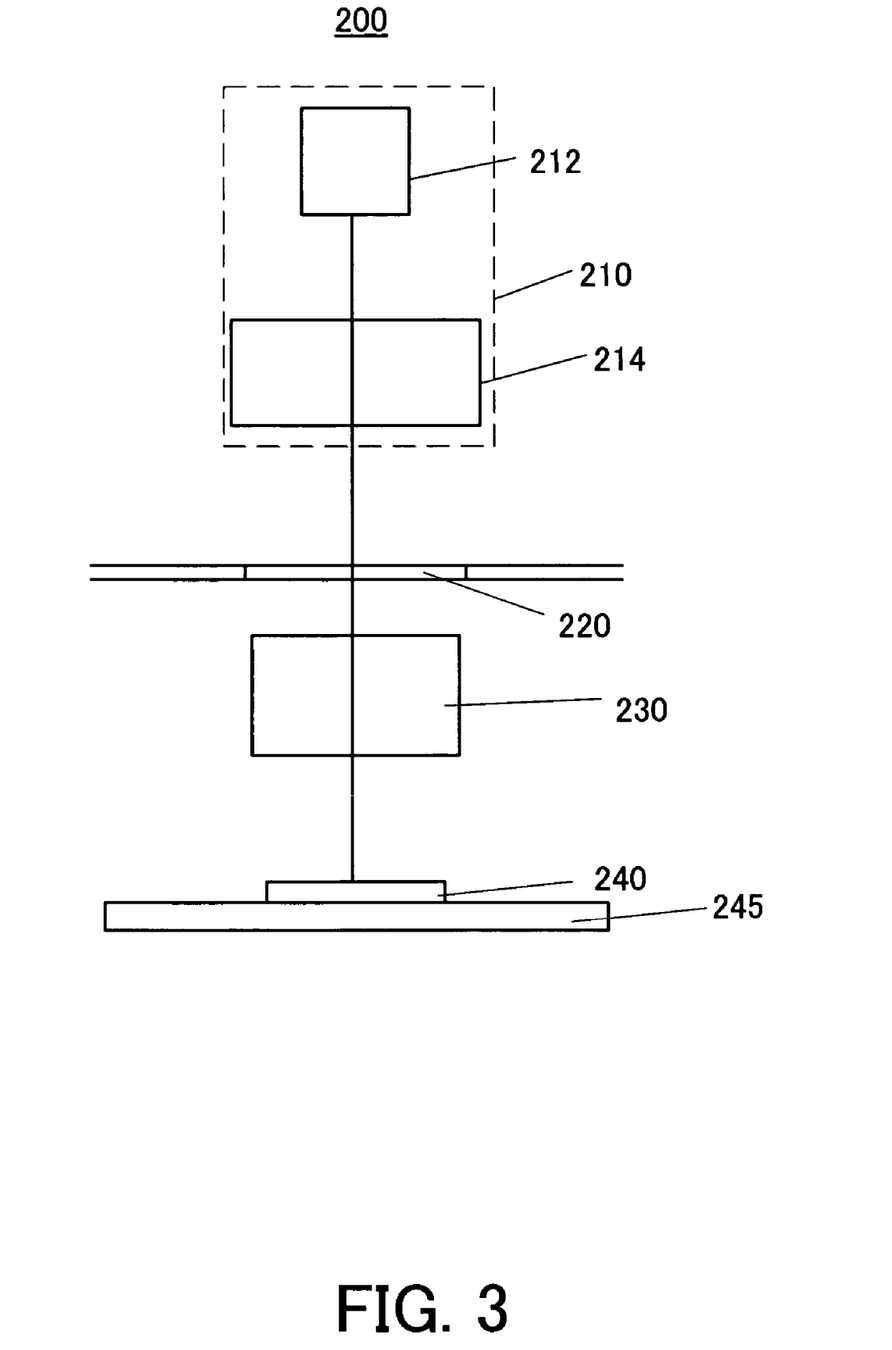
FIG. 3 is a schematic block diagram of an exposure in a process chamber in a processing system shown in FIG. 1.

Referring now to FIG. 3, a description will be given of the exposure apparatus 200 contained as an exposure processing part (or processing station) in a process chamber 110. Here, FIG. 3 is a schematic block diagram of the exposure apparatus 200. The exposure apparatus 200 includes, as shown in FIG. 3, an illumination apparatus 210 for illuminating a mask 220 which forms a circuit pattern, a projection optical system 230 that projects diffracted light created from the illuminated mask pattern onto the object 240, and a stage 245 for supporting the object 240.

The exposure apparatus 200 is a projection exposure apparatus that exposes onto the object 240 a circuit pattern created on the mask 220, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner"). "The step-and-scan manner", as used herein, is an exposure method that exposes a mask pattern onto a wafer by continuously scanning the wafer relative to the mask, and by moving, after a shot of exposure, the wafer stepwise to the next exposure area to be shot. "The step-and-repeat manner" is another mode of exposure method that moves a wafer stepwise to an exposure area for the next shot every shot of cell projection.

The illumination apparatus 210 illuminates the mask 220 which forms a circuit pattern to be transferred, and includes a light source unit 212 and an illumination optical system 214.

The light source unit 212 uses as a light source, for example, as ArF excimer laser with a wavelength of approximately 193 nm, a KrF excimer laser with a wavelength of approximately 248 nm, and $F_2$ excimer laser with a wavelength of approximately 153 nm, but the a type of laser is not limited to excimer laser and a YAG laser may be, for example. Similarly, the number of laser units is not limited. $F_2$ laser with a wavelength of about 157 nm and an extreme ultraviolet ("EUV") light source with a wavelength between about 10 nm and about 20 nm are also applicable. For example, two independently acting solid lasers would cause no coherence between these solid lasers and significantly reduces speckles resulting from the coherence. An optical system for reducing speckles may swing linearly or rotationally. When the light source unit 212 uses laser, it is desirable to employ a beam shaping optical system that shapes a parallel beam from a laser source to a desired beam shape, and an incoherently turning optical system that turns a coherent laser beam into an incoherent one. A light source applicable to the light source unit 212 is not limited to a laser, and may use one or more lamps such as a mercury lamp and a xenon lamp.

The illumination optical system 214 is an optical system that illuminates the mask 220, and includes a lens, a mirror, a light integrator, a stop, and the like, for example, a condenser lens, a fly-eye lens, an aperture stop, a condenser lens, a slit, and an image-forming optical system in this order. The illumination optical system 214 can use any light whether it is axial or non-axial light. The light integrator may include a fly-eye lens or an integrator formed by stacking two sets of cylindrical lens array plates (or lenticular lenses), and be replaced with an optical rod or a diffractive element. The aperture stop can include an annular illumination stop and a quadrupole illumination stop for modified illumination that improves resolution.

The mask 220 is made, for example, of quartz, forms a circuit pattern (or an image) to be transferred, and is supported and driven by a mask stage (not shown). Diffracted light emitted from the mask 220 passes the projection optical system 230, thus and then is projected onto the object 240. The mask 220 and the object 240 are located in an optically conjugate relationship. Since the exposure apparatus 200 of this embodiment is a scanner, the mask 220 and the object 240 are scanned at the speed ratio of the reduction ratio of the projection optical system 230, thus transferring the pattern on the mask 220 to the object 240. If it is a step-and-repeat exposure apparatus (referred to as a "stepper"), the mask 220 and the object 240 stand still in exposing the mask pattern.

The projection optical system 230 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The object 240 is an object to be exposed such as a wafer and a liquid crystal plate, and photoresist is applied onto it.

The stage 245 supports the object 240. The stage 240 may use any structure known in the art, and a detailed description of its structure and operation is omitted. The stage 245 may use, for example, a linear motor to move the object 240 in XY directions. The mask 220 and object 240 are, for example, scanned synchronously, and the positions of the stage 245 and a mask stage (not shown) are monitored, for example, by a laser interferometer and the like, so that both are driven at a constant speed ratio. The stage 245 is installed on a stage stool supported on the floor and the like, for example, via a damper, and the mask stage and the projection optical system 230 are installed on a lens barrel stool (not shown) supported, for example, via a damper to the base frame placed on the floor.

In exposure, light emitted from the light source 212, e.g., Koehler-illuminates the mask 220 via the illumination optical system 214. Light that passes through the mask 220 and reflects the mask pattern is imaged onto the object 240 by a magnification of the projection optical system 230, such as ¼ and ⅕. Since the exposure apparatus 200 is applied to the processing system 100, and provides high-quality devices (such as semiconductor devices, LCD devices, photographing devices (such as CCDs, etc.), thin film magnetic heads, and the like).

Figure 4:
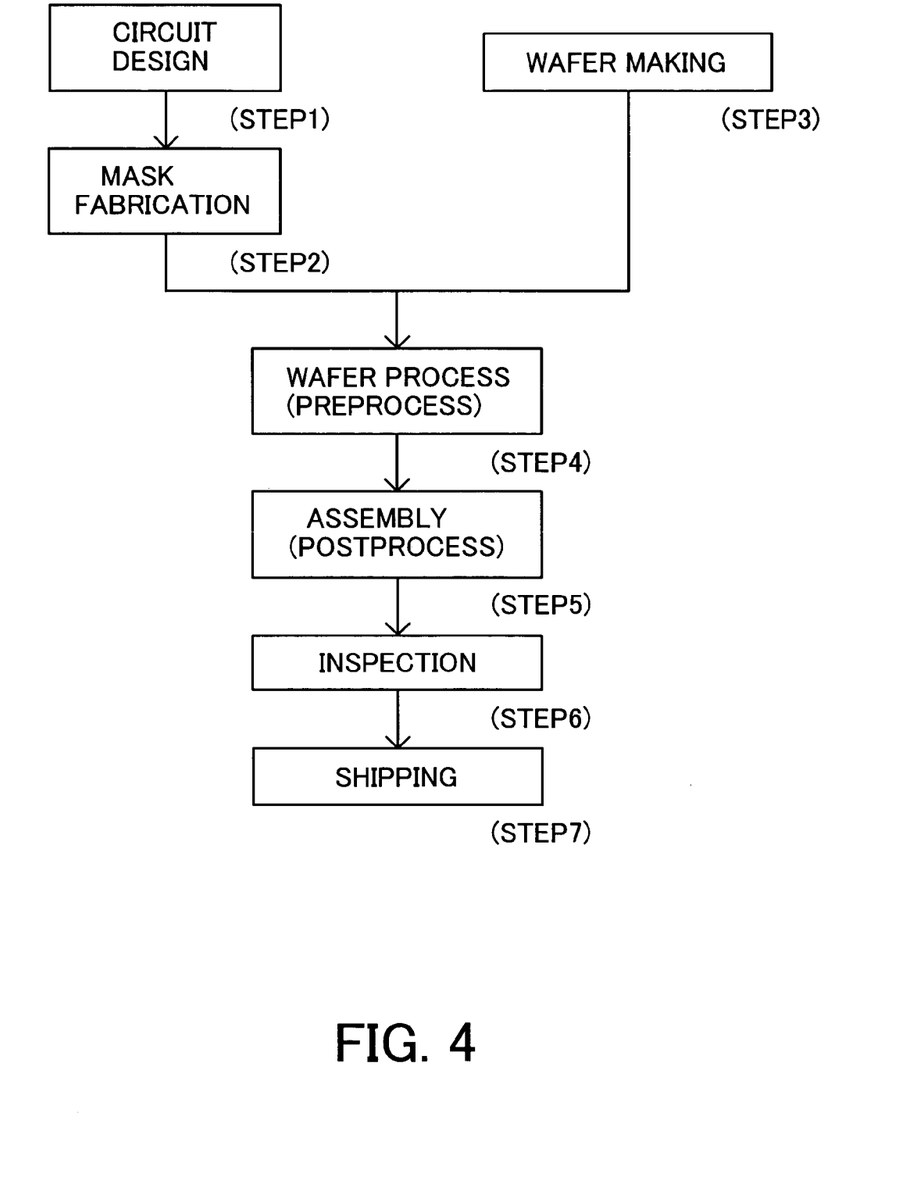
FIG. 4 is a flowchart for explaining a method for fabricating devices (semiconductor chips such as ICs, LSIs, and the like, LCDs, CCDs, etc.).
Figure 5:
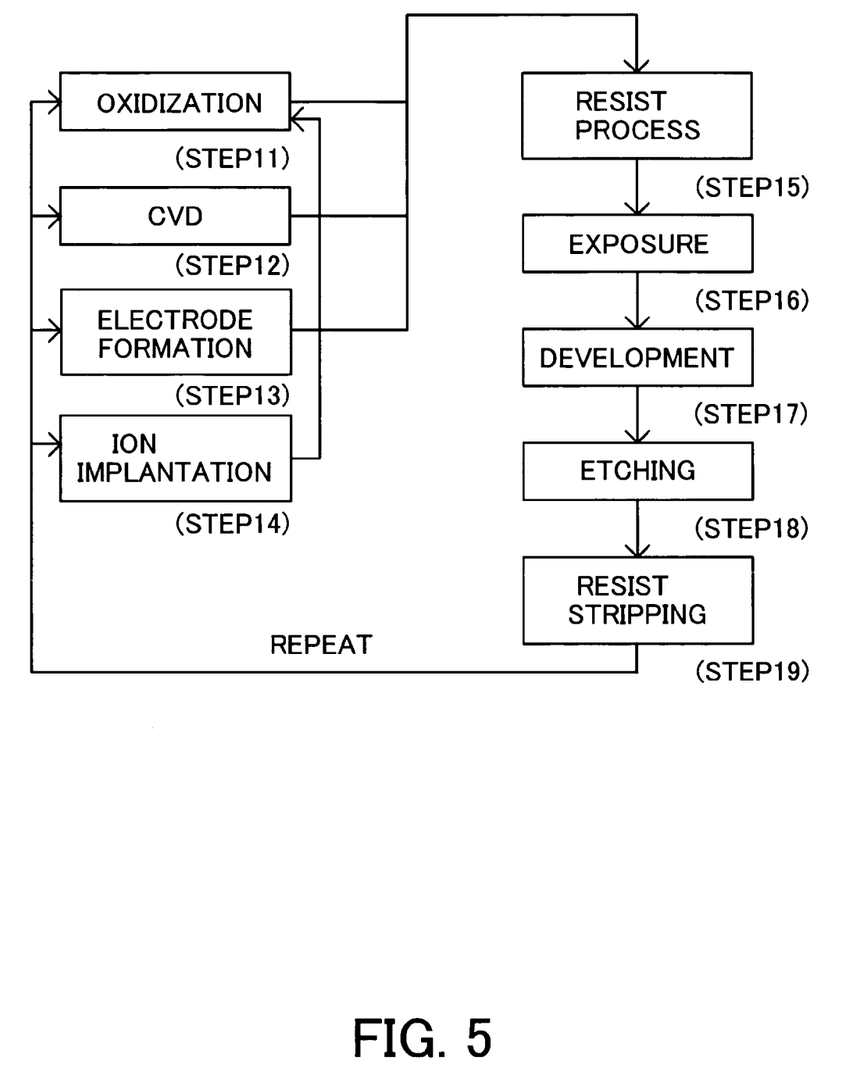
FIG. 5 is a detailed flowchart for Step 4 of wafer process shown in FIG. 4.

Referring now to FIGS. 4 and 5, a description will be given of an embodiment of a device fabrication method using the above mentioned exposure apparatus 200. FIG. 4 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the processing system 100 (or the exposure apparatus 200) to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than conventional. Thus, the device fabrication method using the processing system 100 (or the exposure apparatus 200), and resultant devices constitute one aspect of the present invention.

Further, the present invention is not limited to these preferred embodiments and various variations and modifications may be made without departing from the scope of the present invention.

Thus, the present invention provides a load lock chamber, and a processing system, which maintain predetermined throughput, reduces temperature drops of a wafer caused by adiabatic expansions and particles' adhesions to the wafer in exchanging an atmosphere, and provides high-quality processing.

What is claimed is:

1. A load lock chamber provided between a port that accommodates an object to be processed and is maintained at an ambient pressure, and a process chamber that is maintained at a reduced pressure or vacuum environment and performs a predetermined process for the object, said load lock chamber replacing an atmosphere in said load lock chamber and delivering the object between the port and the process chamber, said load lock chamber comprising:
a first load lock chamber that includes a first holder for holding the object received from the port; and
a second load lock chamber that includes a second holder for holding the object received from the process chamber, wherein the first holder holds more objects than the second holder.

2. A load lock chamber according to claim 1, wherein the first load lock chamber has an inner capacity of about 40 liters, and the second load lock chamber has an inner capacity of about 8 to 10 liters.

3. A load lock chamber according to claim 1, wherein said load lock chamber comprises plural first load lock chambers.

4. A load lock chamber according to claim 1, wherein it takes a longer time to replace an atmosphere in the first load lock chamber than to replace an atmosphere in the second load lock chamber.

5. A processing system comprising:
a port that accommodates an object to be processed and is maintained at an ambient pressure;
a process chamber that is maintained at a reduced pressure or vacuum environment and performs a predetermined process for the object; and
a load lock chamber replacing an atmosphere and delivering the object between the port and the process chamber,
wherein said load lock chamber includes:
a first load lock chamber that includes a first holder for holding the object received from the port; and
a second load lock chamber that includes a second holder for holding the object received from the process chamber, and
wherein the first holder holds more objects than the second holder.

6. An exposure process system comprising a load lock chamber provided between a port that accommodates an object to be processed and is maintained at an ambient pressure, and a process chamber that is maintained at a reduced pressure or vacuum environment and exposes the object, said load lock chamber replacing an atmosphere in said load lock chamber and delivering the object between the port and the process chamber,
wherein said load lock chamber includes:

a first load lock chamber that includes a first holder for holding the object received from the port; and a second load lock chamber that includes a second holder for holding the object received from the process chamber, and wherein the first holder holds more objects than the second holder.

7. An exposure processing system according to claim 6, wherein the first load lock chamber has an inner capacity of about 40 liters, and the second load lock chamber has an inner capacity of about 8 to 10 liters.

8. An exposure processing system according to claim 6, wherein said load lock chamber comprises plural first load lock chambers.

9. An exposure processing system according to claim 6, wherein it takes a longer time to replace an atmosphere in the first load lock chamber than to replace an atmosphere in the second load lock chamber.

10. A device fabrication method comprising:

exposing a pattern on a reticle onto an object using an exposure apparatus; and developing the exposed object, wherein said exposure apparatus includes a load lock chamber provided between a port that accommodates an object to be processed and is maintained at an ambient pressure, and a process chamber that is maintained at a reduced pressure or vacuum environment and exposes the object, said load lock chamber replacing an atmosphere in said load lock chamber and delivering the object between the port and the process chamber, wherein said load lock chamber includes:

a first load lock chamber that includes a first holder for holding the object received from the port; and a second load lock chamber that includes a second holder for holding the object received from the process chamber, and wherein the first holder holds more objects than the second holder.

* * * * *